United States Patent [19]

Katooka et al.

[11] Patent Number: 5,424,915
[45] Date of Patent: Jun. 13, 1995

[54] COOLING STRUCTURE FOR POWER SUPPLY DEVICE

[75] Inventors: Masao Katooka, Kawanishi; Yoshimasa Kawashima, Kobe; Makoto Sakurada, Yao; Atsushi Makitani, Toyonaka, all of Japan

[73] Assignee: Sansha Electric Manufacturing Company, Ltd., Osaka, Japan

[21] Appl. No.: 257,707

[22] Filed: Jun. 10, 1994

[30] Foreign Application Priority Data

Sep. 20, 1993 [JP] Japan .................................. 5-257628

[51] Int. Cl.[6] .............................................. H05K 7/20
[52] U.S. Cl. .................................................. 361/695
[58] Field of Search ................ 307/150; 361/687–688, 361/690–697

[56] References Cited

U.S. PATENT DOCUMENTS

| | | | |
|---|---|---|---|
| 4,035,711 | 7/1977 | Piller | 361/695 |
| 4,236,055 | 11/1980 | Kaminaka | 361/695 |
| 4,956,531 | 9/1990 | Braunijch et al. | 361/695 |

FOREIGN PATENT DOCUMENTS

| | | | |
|---|---|---|---|
| 3268483 | 11/1991 | Japan | 361/695 |
| 585092 | 11/1993 | Japan . | |

*Primary Examiner*—Gregory D. Thompson
*Attorney, Agent, or Firm*—Banner, Birch, McKie & Beckett

[57] ABSTRACT

A power supply device includes power semiconductor devices generating Joule's heat by themselves and circuit components generating no considerable heat by themselves but, as a group, generate a slight rise in temperature, which are included in a power supply circuit of the device. A structure is arranged to forcibly cool these semiconductor devices and circuit components by partitioning the interior of a housing of the Dower supply device to form a passage for an air flow, providing the housing with inlet and outlet openings for the air flow and providing the passage with a ventilating fan.

6 Claims, 3 Drawing Sheets

COOLING STRUCTURE FOR POWER SUPPLY DEVICE

BACKGROUND OF THE INVENTION

This invention relates to a cooling structure for a mower supply device and, especially, to a cooling structure of a power supply device including semiconductor devices which generate much heat and need forced cooling, and circuit components which have poor heat resistance.

It has recently become common to include an invertor circuit in a power supply device used for such purpose as power failure protection, communication or discharge lamp lighting. Power semiconductor devices which are liable to generate Joule's heat are used in such invertor circuits. Moreover, the number of components including the semiconductor devices increases with a trend of multiplication of the invertor circuit and increase in its switching frequency. On the other hand, it becomes necessary to reduce the size of the device and consequently arrange the components in higher density to accommodate a demand for portability of the power supply device. As a result, the power supply device suffers from increased generation of internal heat as lowering of component cooling power and, thus, it is necessary to provide forced cooling means of high cooling power.

Therefore, the inventors of this application have proposed a power supply device provided with such a forced cooling device as disclosed in the Japanese opened patent gazette No. H5(93)-85092. In this device, as shown in FIG. 1, a housing 1 thereof is divided into upper and lower chambers 3 and 4 by a partition wall 2, and air inlet and outlet openings 7 and 8 are formed in side walls 5 and 6 of the upper chamber 3. A ventilating fan 9 is attached inside the air outlet opening 8 in order to forcedly form an air flow from the inlet opening 7 to the outlet opening 8. A cooling fin structure 10 is attached to the partition wall 2 and heat generating power semiconductor devices 11 selected from the power supply circuit are attached onto the fin structure 10. Accordingly, the air coming in from the inlet opening 7 passes as shown over the semiconductor devices 11 and between cooling fins 12 of the fin structure 10 to the outlet opening 8, thereby cooling the semiconductor devices 11. On the other hand, such comcomponents as a battery, capacitor and printed circuit board, which are selected from the power supply circuit components other than the semiconductor devices 11 and which generate no heat by themselves but together cause a slightly rising temperature, are disposed in the lower chamber 4. Thus, the components 13 are separated from the heat generating semiconductor devices 11 and maintained at an acceptable operating temperature in the lower chamber 4.

However, the internal temperature of the lower chamber 4 may increase gradually due to accumulation of heat conducted through the cooling fin structure 10 and partition wall 2, and a little heat generated by the components 13 by themselves, and exceed the threshold temperature of the components 13. Therefore, it is necessary to provide the components 13 in the lower chamber 4 with cooling means as well. However, even if the lower chamber 4 is provided with a ventilation opening for natural cooling through convection, its effect will be small. Also, it is undesirable to provide a ventilation fan in the lower chamber 4 in addition to the upper chamber since this results in an increase both in the size and cost of the device.

SUMMARY OF THE INVENTION

Accordingly, an object of this invention is to provide an improved cooling structure for the power supply device, which can forcedly cool both semiconductor devices 11 and components 13 without adding another ventilation fan.

According to this invention, one of the side walls of the housing of the power supply device, which is divided into upper and lower chambers with a partition wall as described above, has an air inlet opening connected to the lower chamber and an air outlet opening connected to the upper chamber and an air flow passage is formed in the housing from the inlet opening to the outlet opening through the lower and upper chambers sequentially. Moreover a single ventilation fan is disposed in the air passage in order to forcedly form a cooling air flow in the passage.

The above feature and function of this invention will be described in more detail below in connection with its preferred embodiments, with reference to the accompanying drawings.

BRIEF DESCRIPTION OF THE DRAWINGS

Throughout the drawings, same reference numerals are given to corresponding structural components.

DESCRIPTION OF PREFERRED EMBODIMENTS

Figure 1:
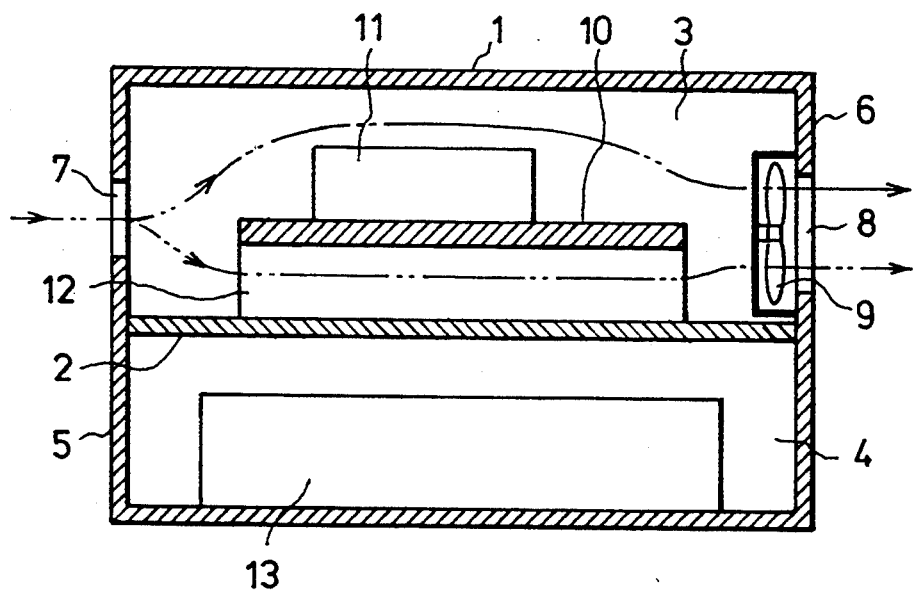
FIG. 1 is a schematic sectional view showing the abovementioned cooling structure for a power supply device according to the prior art.
Figure 2:
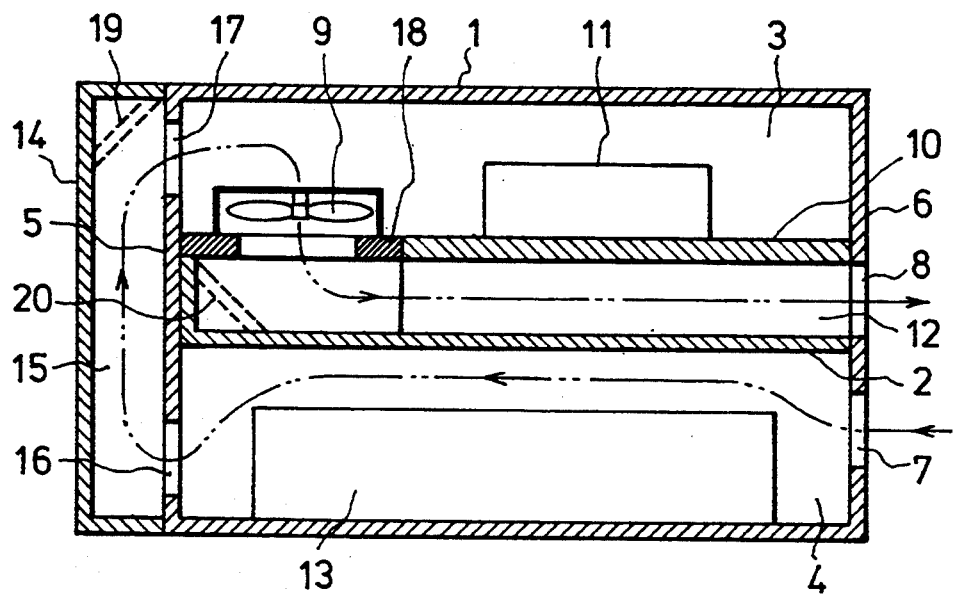
FIG. 2 is a schematic sectional view showing an embodiment of a cooling structure for a power supply device according to this invention.
Figure 3:
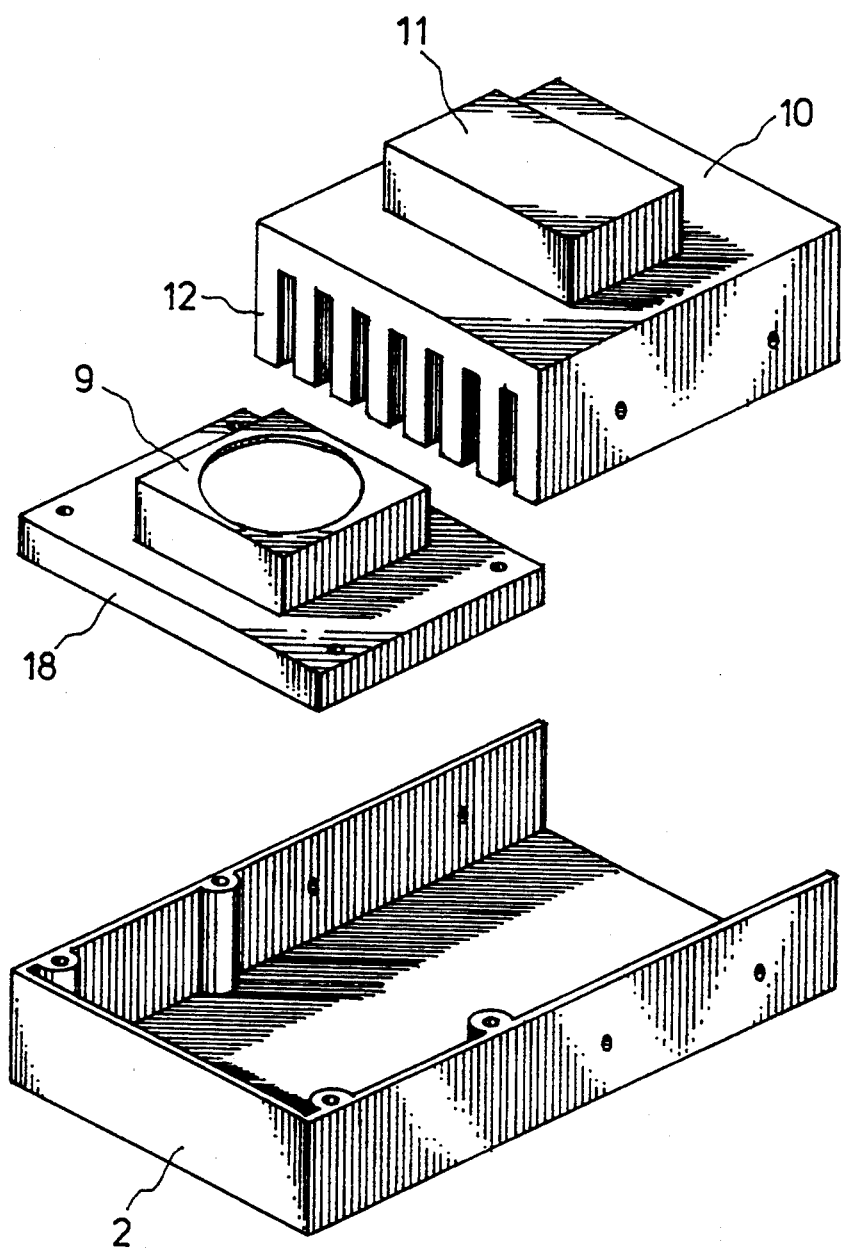
FIG. 3 is a fragmentary isometric view showing some of the structure of the embodiment of FIG. 2, and FIGS. 4 and 5 are schematic sectional views showing other embodiments of a cooling structure for a power supply device according to this invention.

As shown in FIG. 2, the power supply device of the invention has a housing 1 divided into upper and lower chambers 3 and 4 by a partition wall 2, similar to the prior art device shown in FIG. 1. The partition wall 2 has the shape of a box opened at one end as shown in FIG. 3, and the open end is put in contact with one side wall 6 of the housing 1. The side wall 6 has an air outlet opening 8 formed facing the open end of the partition wall 2 and an air inlet opening 7 formed facing the lower chamber 4. An additional box-shaped side wall 14 is connected to the side wall 5 of the housing 1, which is opposite to the side wall 6 to form a side chamber 15 next to the side wall 5. The side wall 5 has an opening 16 for connecting the lower chamber 4 to the side chamber 15 and an opening 17 for connecting the side chamber 15 to the upper chamber 3.

A cooling fin structure 10 having a number of cooling fins 12 as shown in FIG. 3 is fit in part of the box-shaped partition wall 2 and the remainder of the wall 2 is covered with a cover plate 18 having a ventilation fan 9 attached thereto. As shown by arrows in FIG. 2 an air flow passage is thus formed from the air inlet opening 7 to the air outlet opening 8 through the lower chamber 4, opening 16, side chamber 150 opening 170 upper chamber 3, fan 9 and cooling fins 12. As in the prior art structure of FIG. 1, heat generating semiconductor devices 11 are attached onto the fin structure 10 and components 13 which do not generate much heat are disposed in the lower chamber 4. In the structure of the invention, the components 13 are cooled with the external air sucked in by the fan 9 and thermal dissipation of the semiconductor devices 11 is then efficiently effected with the air flow passing between the cooling fins 12. It is preferable that the fin structure 10 is made of a material such as aluminium having high thermal conductivity and that the semiconductor devices 11 are arranged to put their thermal radiation surfaces in intimate contact with the upper face of the structure 10. It is also preferable to dispose slanted planes 19 and 20 (as shown by dashed lines in FIG. 2) in the air flow passage for preventing vortex so as to reduce air flow resistance. Though not shown in the drawings, device components other than the above-mentioned semiconductor devices 11 and components 13 may be disposed suitably in the upper and lower chambers 3 and 4 so as not to obstruct the air flow.

Figure 4:
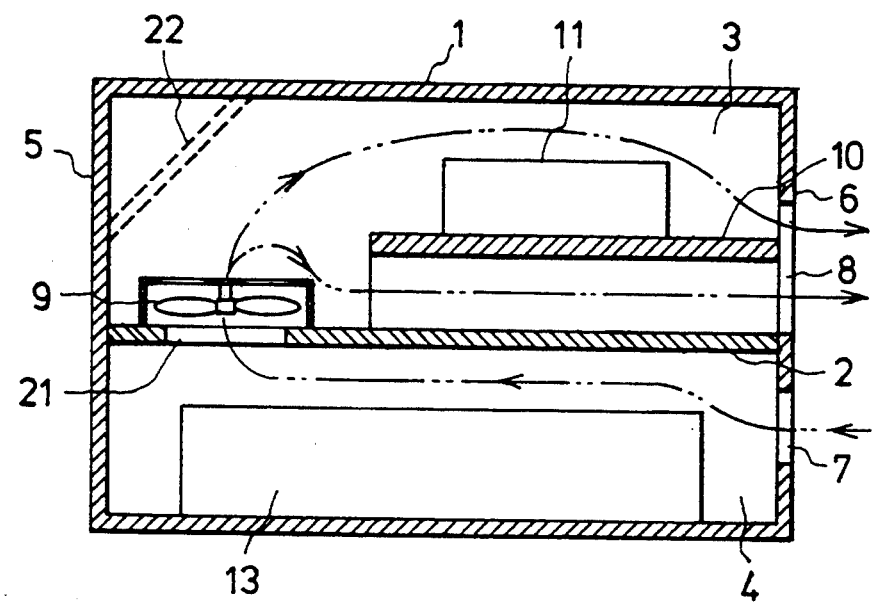

In the second embodiment as shown in FIG. 4, the ventilation fan 9 is disposed facing an opening 21 formed in the partition wall 2 in the vicinity of the side wall 5 and the air outlet 8 is enlarged upwards above the fin structure 10 so that it also connects with the upper part of the upper chamber 3. In this structure, therefore , the air sucked in by the fan 9 cools first the components 13 and, thereafter, it passes between the fins 12 of the fin structure 10 and, at the same time, around the semiconductor devices 11 and then exits through the outlet opening 8. Accordingly, a higher cooling effect is obtainable since the semiconductor devices 11 are cooled by the fin structure 10 as in the first embodiment and, at the same time, directly with the air flow. In the drawings, the numeral 22 denotes a slanted plane preferably disposed for reducing air flow resistance like the above-mentioned slant planes 19 and 20.

Figure 5:
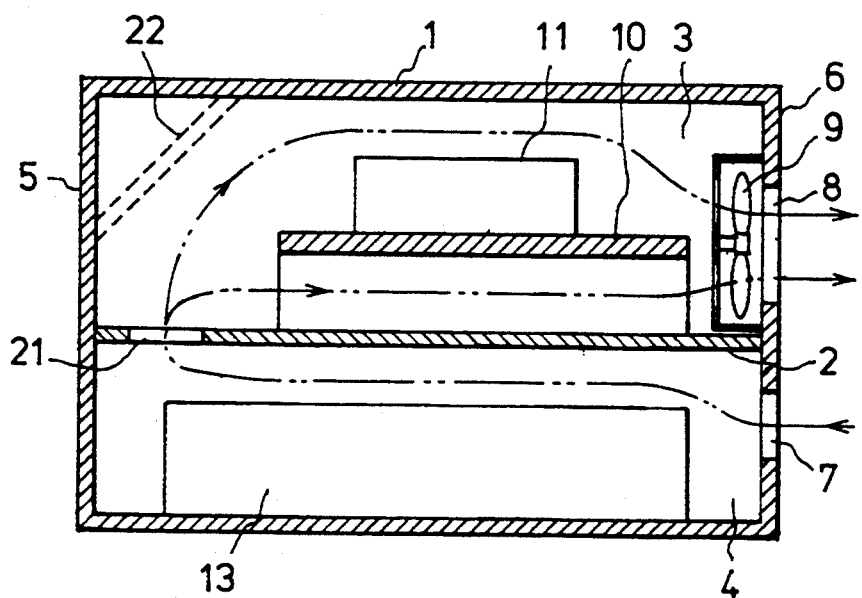

The third embodiment as shown in FIG. 5 is a variation of the embodiment of FIG. 2, which is same in structure as the latter except that the ventilation fan 9 is disposed inside the outlet opening 8 and the cooling fin structure 10 is separated from the side wall 6. In this case, there is some difference in air flow distribution between the semiconductor devices 11 and the fin structure 10, though the air flow direction is unchanged.

As described above, there should be no undesirable rise in temperature in the components 13 in accordance with this invention, since the air sucked in cools first the components 13 which do not generate much heat and, thereafter, the heat generating semiconductor devices 11.

The above embodiments have been presented only for the purpose of illustration. It should be obvious to those skilled in the art that various modifications and changes can be made on these embodiments without departing from the spirit and scope of the invention as defined in the appended claims. For example, the partition wall 2 may be used vertically to arrange the chambers 3 and 4 in the horizontal direction. If necessary, the air inlet and outlet openings 7 and 8 may be formed in the top or bottom wall of the housing 1. Moreover, other heat generating components such as a transformer may be added to the semiconductor devices 11.

We claim:

1. A power supply device comprising:
a housing including first and second side walls facing each other, said first sidewall having spaced air inlet and outlet ports formed therein, said second side wall having two spaced openings formed therein;
a cooling structure comprising:
partition means extending between said first and second side walls for dividing said housing into first and second chambers, said partition means extending from a location between said air inlet and outlet ports in said first side wall to a location between said two openings in said second side wall;
a third side wall forming a third chamber with said second side wall, said third chamber placing said two openings in fluid communication with each other so that an air flow passage is formed by said first, second and third chambers; and
ventilation fan means disposed in said air flow passage for causing air to flow through said air flow passage from said inlet port to said air outlet port; and
a first group of electrical components which do not generate a substantial amount of heat in operation and a second group of electrical components which do generate a substantial amount of heat in operation, said first group of components being disposed in one of said first and second chambers, said second group of components being disposed in the other of said first and second chambers.

2. The power supply device according to claim 1, wherein said air flow passage includes a substantially right-angled corner, and slanting surface means disposed in said corner to prevent vortex in air flow.

3. The power supply device according to claim 1, wherein said partition means is of a box-shape having at least an upward opening, said fan means being secured to said partition means to close at least a part of said upward opening in said partition means.

4. The power supply device according to claim 1, wherein said partition means is of a box-shape having at least an upward opening, said fan means being secured to a cover plate therefor, said cover plate being secured to said partition means to close at least a part of said upward opening in said partition means.

5. The power supply device according to claim 1, wherein said first chamber is located beneath said partition means, and said second chamber is located above said partition means, said partition means being of a box-shape having an upward opening and a sideward opening facing said first side wall, said air outlet port in said first side wall being located to communicate with said sideward opening in said box-shaped partition means, said cooling structure further comprising fin means disposed in said box-shaped partition means, said second group of components being disposed on top of said fin means, said fan means being disposed to close that part of said upward opening of said box-shaped partition means which is adjacent to said fin means in order to feed air to said fin means.

6. The cooling structure according to claim 5, wherein said fan means is secured to a cover plate therefor, said cover plate and said fin means closing said upward opening of said box-shaped partition means.

* * * * *